United States Patent [19]
Mastroianni

[11] Patent Number: 6,068,668
[45] Date of Patent: May 30, 2000

[54] PROCESS FOR FORMING A SEMICONDUCTOR DEVICE

[75] Inventor: Sal Mastroianni, Austin, Tex.

[73] Assignee: Motorola, Inc., Schaumburg, Ill.

[21] Appl. No.: 08/829,297

[22] Filed: Mar. 31, 1997

[51] Int. Cl.[7] .................................................. H01L 21/00
[52] U.S. Cl. ..................... 29/25.01; 414/935; 414/937; 414/940
[58] Field of Search ................... 29/25.01; 414/935–940; 235/382; 454/187

[56] References Cited

U.S. PATENT DOCUMENTS

| | | | |
|---|---|---|---|
| 4,815,912 | 3/1989 | Maney et al. | 414/217 |
| 4,888,473 | 12/1989 | Rossi et al. | 235/376 |
| 5,186,594 | 2/1993 | Toshima et al. | 414/937 |
| 5,261,935 | 11/1993 | Ishii et al. | 414/937 |
| 5,277,579 | 1/1994 | Takanabe | 414/937 |
| 5,417,537 | 5/1995 | Miller | 414/940 |
| 5,447,294 | 9/1995 | Sakata et al. | 266/257 |
| 5,451,131 | 9/1995 | Hecht et al. | 414/217 |
| 5,476,176 | 12/1995 | Gregerson et al. | 414/940 |
| 5,562,383 | 10/1996 | Iwai et al. | 414/940 |
| 5,570,990 | 11/1996 | Bonora et al. | 414/940 |
| 5,664,925 | 9/1997 | Muka et al. | 414/937 |
| 5,752,985 | 5/1998 | Nagafune et al. | 29/25.01 |

*Primary Examiner*—Donald L. Monin, Jr.
*Assistant Examiner*—Michael Dietrich
*Attorney, Agent, or Firm*—Sandra L. Godsey; George R. Meyer

[57] ABSTRACT

A method for forming a semiconductor device in a semiconductor device manufacturing apparatus (20) having a sensor (30) activated extensible shuttle (28). In a fabrication environment shuttle (28) is housed within semiconductor device manufacturing apparatus (20), where an outer door (32) is closed flush with an outer wall of the apparatus (20). As a substrate carrier (38) is moved near the apparatus (20), sensor (30) activates opening of outer door (32) and extension of shuttle (28) out of the apparatus (20) into the fabrication environment. In one embodiment, shuttle (28) has a sensor which is used to determine if carrier (38) is placed on shuttle (28) within a predetermined time, allowing retraction of shuttle (28) until it is required. The present invention increases the available operative space within the fabrication environment, and provides a clean mini-environment within apparatus (20).

30 Claims, 3 Drawing Sheets

PROCESS FOR FORMING A SEMICONDUCTOR DEVICE

CROSS REFERENCE TO A RELATED APPLICATION

The present application is related to co-pending patent application entitled, "Method and Apparatus for Transporting and Using a Semiconductor Substrate Carrier," by Sal Mastroianni et al., application Ser. No. 08/680,343, filed Jul. 12, 1996.

FIELD OF THE INVENTION

The present invention relates to processes for making a semiconductor device in general, and more specifically to processes incorporating a substrate carrier.

BACKGROUND OF THE INVENTION

In the semiconductor industry, the need for clean processing environments is well known. During processing semiconductor substrates are transported in carriers through the processing environment. Conventional semiconductor substrate carriers consist of a box and a cassette. The box is a container with a lid that is hinged. The cassette physically holds semiconductor substrates and fits in the box for transporting purposes. The cassette is removed from the box during a semiconductor processing step at a particular tool. The particle size allowed is dependent upon a minimum geometric feature of the semiconductor process being implemented. As minimum feature sizes become smaller, the need for improved clean room environments will increase. A couple of known means for implementing a mini-environment are described in the Standard Mechanical Interface specification (SMIF) and the carrier systems of U.S. patent application Ser. No. 08/680,343 filed Jul. 12, 1996, and is incorporated herein.

Typically, the carrier is placed onto a non-retractable platform that extends into a processing bay of a semiconductor substrate fabrication facility. The platform interferes with laminar air flow within the fab and requires more fab floor space.

In order to access the enclosed semiconductor substrates, the carrier, sometimes referred to as a pod, is placed upon a receptacle which removes the sealed mini-environment pod door and lowers door and semiconductor substrates into a tool environment where the semiconductor substrates can be further accessed. One problem associated with this type of carrier is that the mechanism which lowers the semiconductor substrates into the tool environment does so by lowering the pod door. This permits the outside of the door, which has been exposed to the relatively dirty manufacturing environment, to be lowered through the tool mini-environments where a stricter clean room standard is maintained. The result is potential contamination of the mini-environment.

The prior art manufacturing apparatus, illustrated in FIG. 1, intrudes into the operative floor space of the fabrication environment, prohibiting operator interface within full effective ergonomic limits. Operators are not able to freely navigate through the fabrication environment. In designing such environments it is desirable to maximize the space available. Additionally, as fabrication automation increases, it is desireable to reduce the requirement for direct operation of floor switches and buttons. Therefore, a need exists to have a fabrication environment where manufacturing apparatus is streamline, operative space is maximized, and operator interface is facilitated.

DETAILED DESCRIPTION OF THE PREFERRED EMBODIMENT

Figure 1:
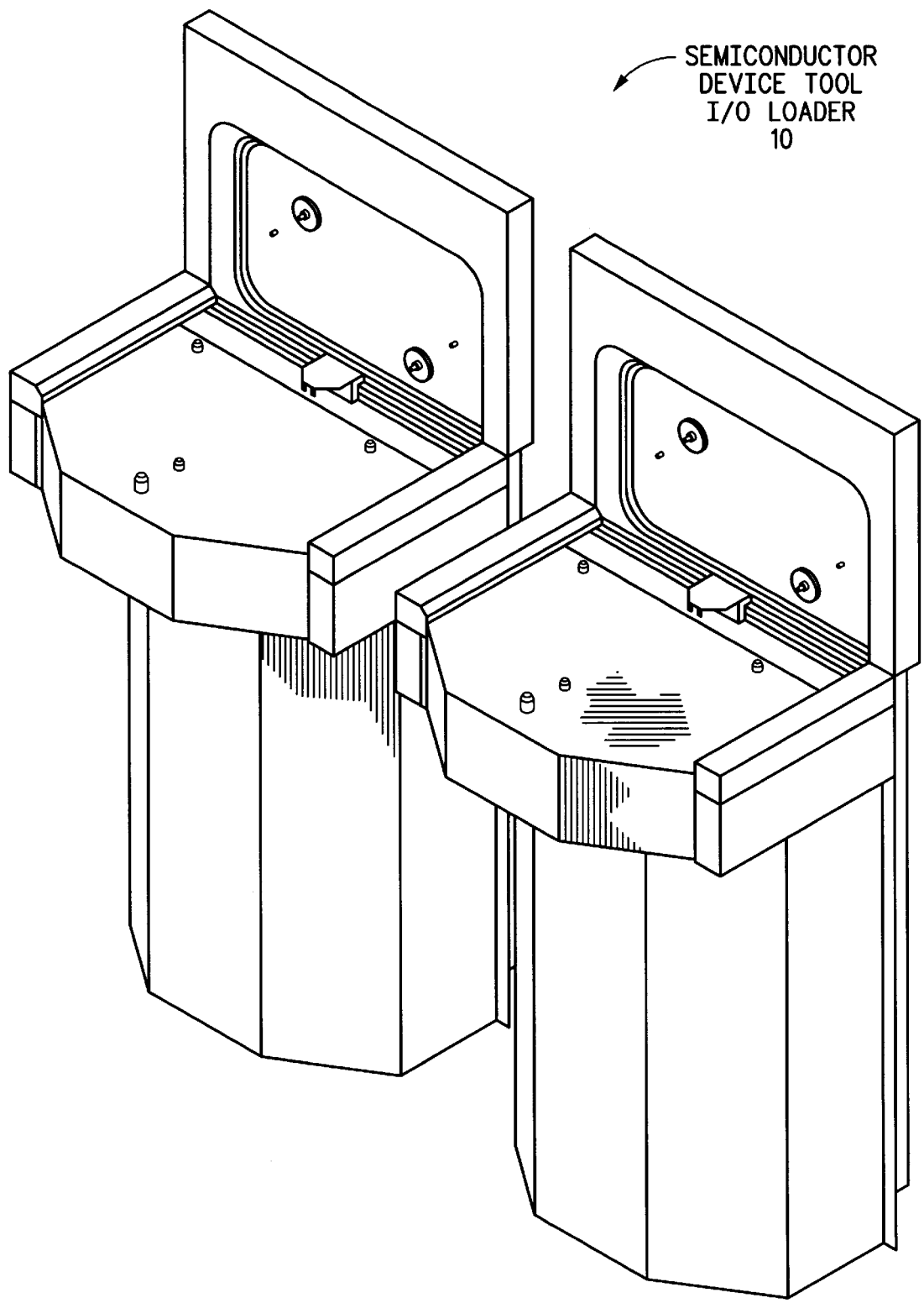
FIG. 1 includes an illustration of a perspective view of two semiconductor device tool loaders mounted against a wall of a fab environment.

The present invention offers a method of forming a semiconductor device within a fabrication environment which reduces the operative floor space, provides an operator interface within ergonomic limits, and increases cleanliness in the fabrication environment. The prior art manufacturing apparatus, illustrated in FIG. 1, intrudes into the operative floor space of the fabrication environment. It is desirable to have a planar surface on the manufacturing apparatus with no permanent protrusions. Operators are then able to freely navigate through the fabrication environment. In designing such environments it is also desirable to maximize the space available. According to the present invention, an extensible tray is provided on demand to receive substrate carriers provided by the operator, but is also applicable in an automated system. A sensor determines when a carrier is near the apparatus and extends the tray into the fabrication environment. In one embodiment, the sensor also drives a front door to open prior to extension of the tray. The tray is then retracted to continue processing.

Figure 2:
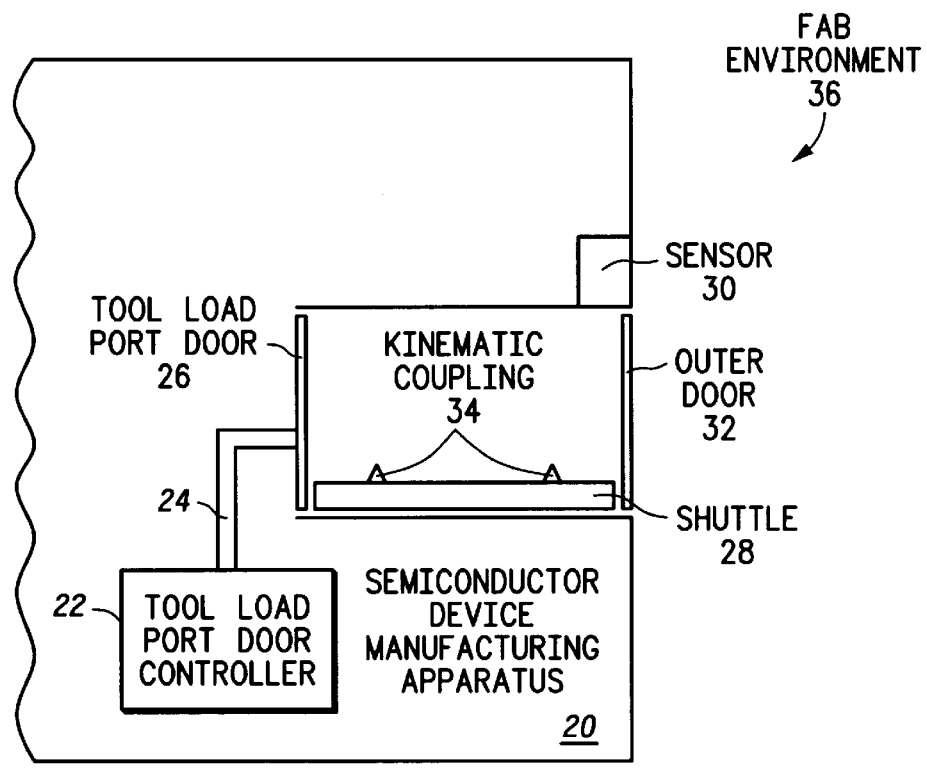
FIG. 2 includes an illustration of a cross-sectional view of a semiconductor device manufacturing apparatus in accordance with one embodiment of the present invention.

In one embodiment of the present invention, illustrated in FIG. 2, a semiconductor device manufacturing device apparatus 20 includes a tool load port door controller 22, a tool load port door 26, an engaging mechanism 24 connected to the tool load port door 26 and the tool load port door controller 22. The apparatus further includes an outer door 32, a shuttle 28 (tray), and a sensor 30. The shuttle 28 includes kinematic coupling features 34 (alignment features). The sensor 30 is used to control the opening and closing of the outer door 32, as well as the extension of loading shuttle 28. Although not shown, according to one embodiment, there is a sensor contained within shuttle 28 that is used to determine whether a substrate carrier has been placed on the shuttle 28. The sensor 30 and the sensor within the shuttle 28 (not illustrated) may be of a type including short range infrared, long range infrared, long range radio frequency, or photo detectors.

The apparatus, including the outer door 32, forms a generally planar surface that does not have any portions which extend into the fab environment 36. The cleanliness of the apparatus and fab are maintained, such that the cleanliness inside the tool load port door of the semiconductor manufacturing apparatus is at least one hundred times cleaner than the fab environment. More specifically, the interior portions of the apparatus are expected to be at least one thousand time cleaner than the fab environment. As used in this specification, cleanliness refers to the amount of particles measured per volume of sampled air. In one particular embodiment, the fab is at ten 0.5 micron particles per cubic foot (no more than 353 particles per cubic meter) whereas the carrier and interior portions of the apparatus 20 are at no more than one 0.5 micron particle per one hundred cubic feet (no more than 35 particles per one hundred cubic meter). In reality, there should be no more than one particle within the carrier or interior portion of the apparatus per one thousand cubic feet of air.

Figure 3:
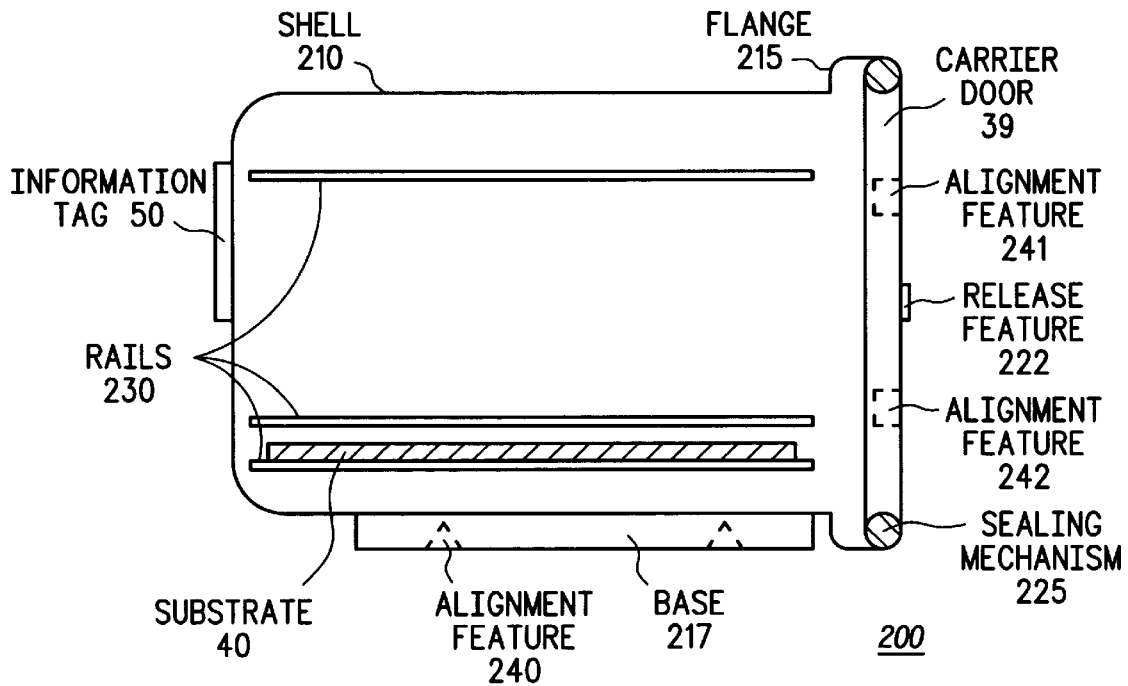
FIG. 3 includes an illustration of a cross-sectional view of a semiconductor substrate carrier.

FIG. 3 includes an illustration of a semiconductor substrate carrier 38. The carrier 38 includes a shell 210, a flange 215, and rails 230 that are bonded to the shell 210. The semiconductor substrate carrier 38 is designed to hold a maximum of 13 to 25 semiconductor substrates 40. Further illustrated in FIG. 3 is a carrier door 39 that includes a release feature 222 and sealing mechanism 225 that seals the door against the flange 215. Additionally, the carrier 38 also includes a base 217 and alignment features 240 that receive the kinematic coupling features from the shuttle 28. The carrier 38 also includes an information tag 50 that typically includes processing and status information such as the lot number, the number of wafers, and the wafer number.

Figure 4:
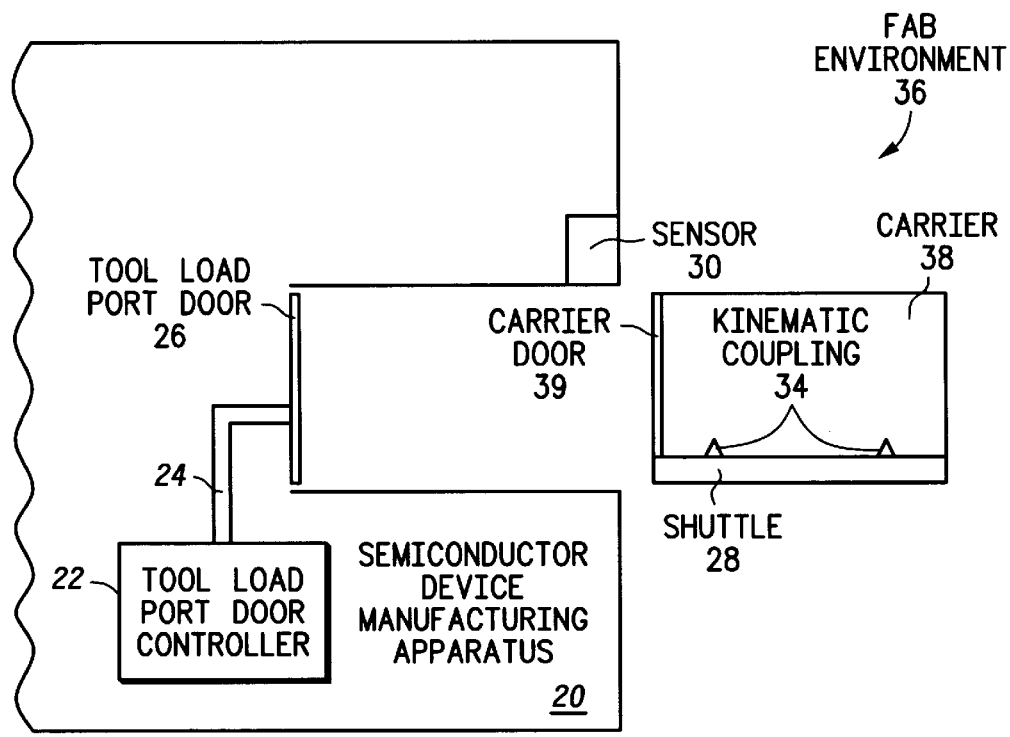
FIG. 4 includes an illustration of a cross-sectional view of the semiconductor device manufacturing apparatus of FIG. 2 after loading the substrate carrier of FIG. 3 onto a shuttle in accordance with one embodiment of the present invention.
Figure 5:
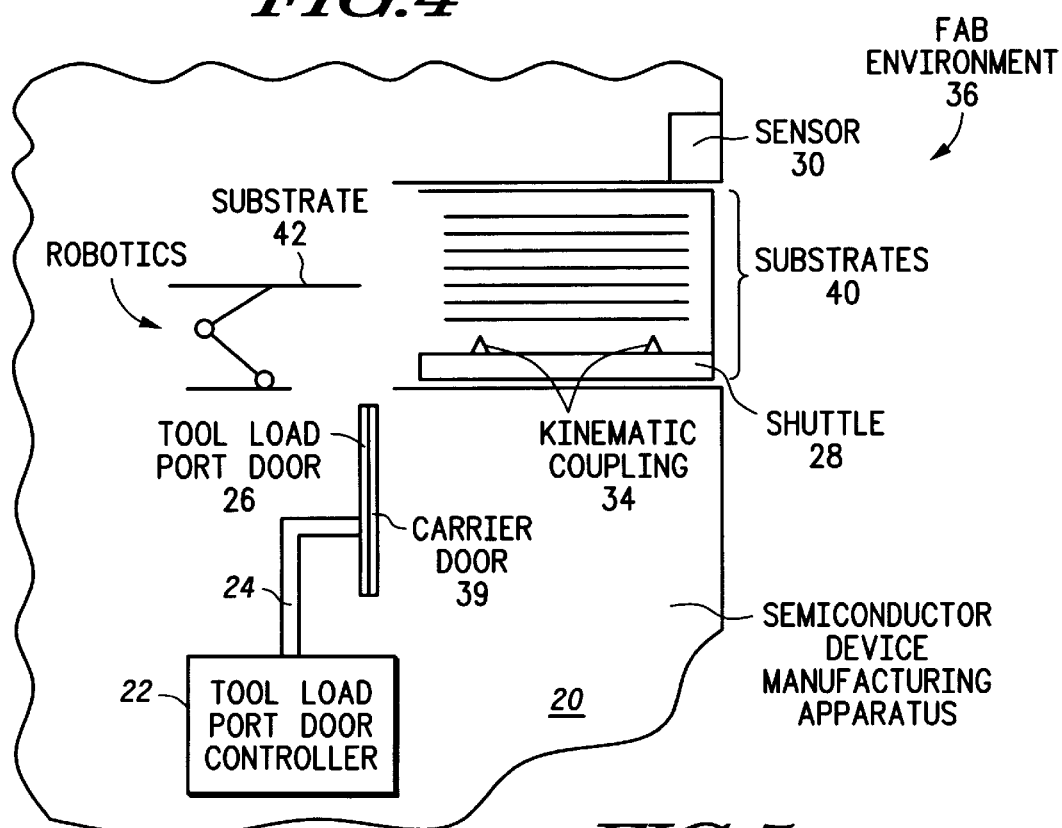
FIG. 5 includes an illustration of a cross-sectional view of the semiconductor device manufacturing apparatus of FIG. 2 after loading the semiconductor substrate carrier of FIG. 3 into the apparatus and opening the carrier and tool load port doors.

In operation, as illustrated in FIGS. 2, 4, and 5, as the carrier 38 is moved near the apparatus 20, sensor 30 sense that the carrier 38 has been so positioned and indicates that outer door 32 is to now open and that the shuttle 28 is to extend into the fab environment 36 so that the carrier 38 may be readily placed on the shuttle 28. Note that for clarity outer door 32 is not illustrated in FIGS. 4 and 5. The alignment features on the shuttle 28 and the carrier 38 allow for kinematic coupling that accurately position the carrier 38 where it needs to be placed on the shuttle 28. Kinematic coupling allows placement with a minimum of alignment difficulty.

After the carrier 38 has been placed on the shuttle 28 a sensor within the shuttle 28 senses that the carrier 38 has been placed in position, and the shuttle 28 is retracted back into the apparatus 20. After the shuttle 28 has been fully retracted into the apparatus 20, the outer door 32 is closed and will not be allowed to open until after processing of the substrates 40 within carrier 38 is completed. If another carrier passes by sensors 30 while carrier 38 is being processed the outer door 32 will not open. This will prevent the likelihood of disrupting the apparatus 20 during processing or moving the carrier 38 after it has been placed in position.

Once closed, the doors 26 and 39 are coupled to each other by vacuum or other means. The doors 26 and 39 are then removed from the plane of travel of the substrate 40 by the controller 22. More particularly, the doors 26 and 39 are moved below the port opening for the door 26. Robotics within the apparatus 20 remove substrates 42 and place them in the processing chamber. These processing steps may be selected from a deposition, an etch, a heat cycle, an implant step, or a lithography step. The processing step may also include moving wafers from one cassette to another. This may be particularly useful for breaking off split lots from the main lot or for combining split lots with a parent lot after an experimental split has been performed.

Clearly, there are many other types of embodiments that can use the concepts of the present invention. For example, the outer door 32 is not required in one embodiment of the present invention. In this case there would just be a port for the shuttle 28 and carrier 38 pass through. This port is exposed to the fab environment 26. In this instance, the sensor 30 would only be used to extend the shuttle 28 from the apparatus 20, so that the carrier 38 can be loaded onto the shuttle 28.

In still another embodiment, the sensor 30 has an integrated time delay, where after an electronic signal shows that the sensor 30 has been activated, a set time delay (e.g. two seconds) elapses before the shuttle 28 is extended out of the apparatus 20. By using this time delay, stray signals, such as a person walking by the apparatus 20, should not activate a false shuttle movement. A second time delay may be used to restart the shuttle 28, where if a carrier 38 is not sensed within the second predetermined time period (e.g. ten seconds) the shuttle 28 is retracted into the apparatus 20. By using this second time delay the shuttle 28 does not remain extended out of apparatus 20 awaiting the next cassette to be loaded. Here if a prior load operation was not completed, the shuttle 28 will retract and the outer door 32 close. In alternate embodiments of the present invention either time delay may be programmable.

In other embodiments, multiple sensors may be positioned on various axes. In one embodiment, the sensors may be placed in both the x axis and the y axis near the edges of the carrier 38. By doing this it is better ensured that the apparatus 20 will properly sense and prepare to receive carrier 38 only if such carrier 38 is the proper design for the apparatus 20.

In still another embodiment, the identification tags 50 may be utilized either in conjunction with or independently of the sensors 30. The tags typically have lot and processing information for the substrates 40. The tags 50 reduce the likelihood of processing errors.

A stocker system can be used with the apparatus 20. A stocker is capable of storing multiple carriers within the apparatus 20. This allows for the loading of many carriers 38 into the apparatus 20 to allow for non stop operation without any manual or automated substrate delivery interfacing for a set time period. In addition, a stocker, the apparatus 20 and other apparatuses within the fab may be connected to a host controller. The host controller can determine the order in which the carriers are to be processed. For example, a host controller can use a first-in-first-out procedure where the first carrier that is loaded will be the first one processed and the last carrier into the stocker will be the last carrier processed. Additionally, the host controller may be more sophisticated and can direct the processing order based on equipment availability. For example, if one apparatus is either down or is a bottleneck for the fab, the host controller may direct the apparatus 20 to process substrates that will be directed to other apparatuses that are either idle or do not have as much of a backlog. Additionally, the host controller can also rearrange the order based on the priority of the lot. For example, if a high priority lot needs to be processed first, it will be taken out of order and processed first. All of these and other options are available and can be programmed into the host controller as the proper operation of the fab dictates.

In still another embodiment, the shuttle 28 may be replaced by a fixed platform (tray). If a fixed platform is used it will still have the kinematic coupling features 34 as illustrated in FIG. 2. However, in this case, the platform does not move out of the apparatus but remains essentially stationary in a fixed position. If a fixed platform is used, it should be integrated into a system that has automated guided vehicles (AGV). Automated guided vehicles are a robotics type of machinery used to transport the carriers between various apparatuses. These vehicles have benefits over human operated systems. For example, the vehicles may communicate with a host controller so that the vehicle knows what the lot is and where it is to go. Such vehicles also have greater positioning ability than what is possible with humans. This combined with the possibility of vision detection of the kinetic coupling features 34 allow the positioning of the carrier 38 within the opening of the apparatus 20.

The foregoing description demonstrates many of the advantages of practicing the present invention. The extensible tray allows for a streamline fabrication environment, eliminating the permanently protruding platforms of the prior art. The extensible tray is provided on demand, and is activated by a sensor as an operator or carrier move near the manufacturing apparatus. The operator is provided increased flexibility and certainty during the processing operation. By providing a sensed extension shuttle 28, the operator may maintain a firm hold on the carrier 38 while moving the carrier 38 during processing. The present invention offers an accurate method of processing larger diameter substrates. One type of substrate includes a 300 millimeter substrate having critical dimensions no greater than 0.25 microns. The present invention is particularly applicable to processing of such a substrate, as the increased substrate diameter makes the operator's task of transporting substrate carrier unwieldy.

Thus it is apparent that there has been provided, in accordance with the invention, a process to incorporate a streamline fabrication environment, an ergonomic operator interface, and a clean mini-environrment in processing a semiconductor substrate. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, any number of sensor mechanisms are currently available and may be combined. The sensing operation may include reading processing information and making decisions based on that information. Therefore, it is intended that this invention encompass all such variations and modifications as fall within the scope of the appended claims.

What is claimed is:

1. A process for fabricating a semiconductor device comprising:
    moving a substrate carrier near a port of a semiconductor device manufacturing apparatus, wherein:
        the semiconductor device manufacturing apparatus has a first door and a first tray positioned internally; and
        the substrate carrier has a shell and a carrier door;
    sensing the substrate carrier with the semiconductor device manufacturing apparatus when near but before contacting the semiconductor device manufacturing apparatus, wherein sensing further comprises detecting a substrate carrier with a sensor unit contained within the semiconductor device manufacturing apparatus;
    opening an outer door in response to sensing the substrate carrier when near but before contacting the semiconductor device manufacturing apparatus, the outer door positioned at the port of the semiconductor device manufacturing apparatus, the outer door being substantially flush with an outer wall of the semiconductor device manufacturing apparatus when closed;
    in response to sensing, extending the first tray into a fabrication environment that lies outside of the semiconductor device manufacturing apparatus;

placing the substrate carrier including the shell onto the first tray while the first tray is extended into the fabrication environment; and
    retracting the first tray into the semiconductor device manufacturing apparatus while the substrate carrier including the shell is on the first tray.

2. The process of claim 1, further comprising:
    coupling the first door to the carrier door; and
    moving the coupled doors to a first position which allows extraction of a first substrate from the substrate carrier.

3. The process of claim 2, further comprising performing an act selected from a group consisting of:
    extracting the first substrate from the substrate carrier;
    depositing a first film on the first substrate;
    etching the first film on the first substrate;
    heating the first substrate;
    implanting the first substrate; and
    patterning a resist layer over the first substrate.

4. The process of claim 1, wherein the sensor unit comprises:
    a light sensor.

5. The process of claim 1, wherein the sensor unit comprises:
    a radio frequency sensor.

6. The process of claim 1, wherein:
    the substrate carrier has an information tag attached to an exterior of the substrate carrier; and
    sensing the substrate carrier further comprises:
        reading the information tag of the detected substrate carrier from the sensor unit.

7. The process of claim 6, wherein the information tag has substrate carrier processing and status information.

8. The process of claim 1, further comprising closing the outer door after a predetermined time period where the predetermined time period is initiated when opening the outer door.

9. The process of claim 1, further comprising:
    closing the outer door subsequent to retracting the first tray.

10. The process of claim 1 wherein opening the outer door is performed a predetermined time period after sensing the substrate carrier.

11. The process of claim 1, wherein retracting the first tray is performed after a predetermined time period.

12. The process of claim 1 wherein moving comprises moving the substrate carrier near the port of the semiconductor device manufacturing apparatus the further comprises a second door and a second tray positioned internally.

13. The process of claim 12 further comprising determining a next substrate carrier for processing.

14. The process of claim 1 wherein:
    the substrate carrier contains a plurality of substrates.

15. The process of claim 1 wherein moving the substrate carrier is performed by an automated guided vehicle (AGV).

16. The process of claim 1 wherein
    the semiconductor device manufacturing apparatus is 100 times cleaner than the fabrication environment.

17. The process of claim 1, wherein:
    the substrate carrier and first tray have complementary kinematic coupling features.

18. A process for fabricating a semiconductor device comprising:
    moving a substrate carrier near a port of a semiconductor device manufacturing apparatus, wherein:

the semiconductor device manufacturing apparatus has a first door and a first tray positioned internally; and the substrate carrier has a shell and a carrier door;

sensing the substrate carrier with the semiconductor device manufacturing apparatus when near but before contacting the semiconductor device manufacturing apparatus, wherein sensing further comprises detecting a substrate carrier with a sensor unit contained within the semiconductor device manufacturing apparatus;

opening an outer door in response to sensing the substrate carrier when near but before contacting the semiconductor device manufacturing apparatus, the outer door positioned at the port of the semiconductor device manufacturing apparatus, the outer door being substantially flush with an outer wall of the semiconductor device manufacturing apparatus when closed;

in response to sensing, extending the first tray into a fabrication environment that lies outside of the semiconductor device manufacturing apparatus;

placing the substrate carrier including the shell onto the first tray while the first tray is extended into the fabrication environment; and retracting the first tray into the semiconductor device manufacturing apparatus while the substrate carrier including the shell is on the first tray.

19. The process of claim 18, further comprising performing an act selected from a group consisting of:

extracting the first substrate from the substrate carrier;

depositing a first film on the first substrate;

etching the first film on the first substrate;

heating the first substrate;

implanting the first substrate; and patterning a resist layer over the first substrate.

20. The process of claim 18, wherein the sensor unit comprises:

a light sensor.

21. The process of claim 20, wherein the sensor unit comprises:

a radio frequency sensor.

22. The process of claim 18, wherein:

the substrate carrier has an information tag attached to an exterior of the substrate carrier; and determining the substrate carrier is near further comprises:

reading the information tag of the detected substrate carrier from the sensor unit.

23. The process of claim 22, wherein the information tag has substrate carrier processing and status information.

24. The process of claim 18, further comprising:

closing the outer door after a predetermined time period where the predetermined time period is initiated when opening the outer door.

25. The process of claim 18, wherein opening the outer door is performed a predetermined time period after determining the substrate carrier is near.

26. The process of claim 18 wherein inserting comprises inserting the substrate carrier into the port of the semiconductor device manufacturing apparatus which further comprises a second door and a second tray positioned internally.

27. The process of claim 25 further comprising determining a next substrate carrier for processing.

28. The process of claim 18 wherein inserting the substrate carrier is performed by an automated guided vehicle (AGV).

29. The process of claim 18 wherein the first and second kinematic features have a substantially triangular shape when viewed in cross section.

30. The process of claim 18, wherein:

the substrate carrier and first tray have complementary kinematic coupling features.

* * * * *